US012779498B2

(12) United States Patent
Imaji et al.

(10) Patent No.: US 12,779,498 B2
(45) Date of Patent: Nov. 3, 2026

(54) TRANSPARENT PIEZOELECTRIC LAMINATED FILM AND TOUCH PANEL

(71) Applicant: KUREHA CORPORATION, Tokyo (JP)

(72) Inventors: Makoto Imaji, Tokyo (JP); Ryosuke Tamamura, Tokyo (JP); Kei Yamaguchi, Tokyo (JP)

(73) Assignee: KUREHA CORPORATION, Tokyo (JP)

( * ) Notice: Subject to any disclaimer, the term of this patent is extended or adjusted under 35 U.S.C. 154(b) by 828 days.

(21) Appl. No.: 18/250,481

(22) PCT Filed: Oct. 18, 2021

(86) PCT No.: PCT/JP2021/038365
§ 371 (c)(1),
(2) Date: Apr. 25, 2023

(87) PCT Pub. No.: WO2022/091827
PCT Pub. Date: May 5, 2022

(65) Prior Publication Data
US 2025/0339876 A1 Nov. 6, 2025

(30) Foreign Application Priority Data
Oct. 30, 2020 (JP) ................................ 2020-183101

(51) Int. Cl.
*B06B 1/06* (2006.01)
*H10N 30/857* (2023.01)
*G06F 3/041* (2006.01)

(52) U.S. Cl.
CPC ......... *B06B 1/0688* (2013.01); *H10N 30/857* (2023.02); *G06F 3/0412* (2013.01); *G06F 2203/04105* (2013.01)

(58) Field of Classification Search
CPC ...... H10N 30/883; H10N 30/30; G06F 3/041; G06F 2203/04105; G06F 3/0414;
(Continued)

(56) References Cited

U.S. PATENT DOCUMENTS 2,928,409 A * 3/1960 Johnson ............... G05D 16/028
91/363 R
3,107,630 A * 10/1963 Johnson ................ F04B 17/003
310/317
(Continued)

FOREIGN PATENT DOCUMENTS

CN 1531721 A * 9/2004 ......... H03H 9/02149
CN 101409536 A * 4/2009 ............. H03H 9/562
(Continued)

OTHER PUBLICATIONS

Office Action for TW110139472, dated Dec. 28, 2023, 4 pages.
(Continued)

*Primary Examiner* — Pedro J Cuevas
(74) *Attorney, Agent, or Firm* — Abel Schillinger, LLP

(57) ABSTRACT

To prevent discoloration of a transparent piezoelectric film made of a fluororesin in a transparent piezoelectric laminated film including the transparent piezoelectric film. A transparent piezoelectric laminated film including, by sequentially stacking, a transparent piezoelectric film made of a fluororesin, a transparent coating layer having a thickness of 0.20 μm or more, and a transparent adhesive layer.

6 Claims, 2 Drawing Sheets

(58) Field of Classification Search
CPC .......... B32B 2307/412; B32B 2307/20; B32B 2307/7376; B32B 2457/208
See application file for complete search history.

(56) References Cited

U.S. PATENT DOCUMENTS

| | | | | | |
|---|---|---|---|---|---|
| 3,388,334 | A | * | 6/1968 | Adler | H03F 13/00 331/107 A |
| 6,364,221 | B1 | * | 4/2002 | Czimmek | F02M 69/041 239/5 |
| 6,570,474 | B2 | * | 5/2003 | Czimmek | F01L 9/20 123/90.11 |
| 6,702,250 | B2 | * | 3/2004 | Czimmek | F16K 31/02 123/90.11 |
| 7,687,971 | B2 | * | 3/2010 | Stokes | H03H 9/25 310/313 R |
| 9,343,653 | B2 | * | 5/2016 | Kaimori | H10N 30/857 |
| 10,008,659 | B2 | * | 6/2018 | Park | H10N 30/302 |
| 11,424,402 | B2 | * | 8/2022 | Kodani | H10N 30/704 |
| 11,532,246 | B2 | * | 12/2022 | Yan | H10K 59/00 |
| 11,999,157 | B2 | * | 6/2024 | Toyooka | B32B 27/08 |
| 2001/0045880 | A1 | * | 11/2001 | Czimmek | F16K 31/02 335/215 |
| 2003/0137376 | A1 | * | 7/2003 | Czimmek | F01L 9/20 335/215 |
| 2006/0152136 | A1 | | 7/2006 | Fujikake et al. | |
| 2008/0042517 | A1 | * | 2/2008 | Stokes | H03H 9/25 310/317 |
| 2013/0249354 | A1 | * | 9/2013 | Watanabe | G01B 11/0625 29/25.35 |
| 2015/0015120 | A1 | | 1/2015 | Kaimori et al. | |
| 2016/0291729 | A1 | * | 10/2016 | Schardt | G06F 3/016 |
| 2017/0218117 | A1 | * | 8/2017 | Tanimoto | H10N 30/857 |
| 2020/0303619 | A1 | * | 9/2020 | Kodani | H10N 30/302 |
| 2021/0343927 | A1 | * | 11/2021 | Nagaoka | H10N 30/079 |
| 2021/0407337 | A1 | * | 12/2021 | Yan | G09F 9/301 |
| 2022/0037580 | A1 | * | 2/2022 | Nakamura | H10N 30/708 |
| 2023/0025871 | A1 | * | 1/2023 | Toyooka | C09D 5/006 |
| 2023/0422628 | A1 | * | 12/2023 | Imaji | H10N 30/857 |
| 2024/0188445 | A1 | * | 6/2024 | Imaji | H10N 30/883 |
| 2024/0196750 | A1 | * | 6/2024 | Imaji | C08J 7/0423 |
| 2024/0260476 | A1 | * | 8/2024 | Miyoshi | H10N 30/88 |
| 2024/0415020 | A1 | * | 12/2024 | Imaji | B32B 27/00 |
| 2024/0415022 | A1 | * | 12/2024 | Imaji | H10N 30/857 |
| 2025/0219610 | A1 | * | 7/2025 | Kornbluth | H03H 9/173 |
| 2025/0318433 | A1 | * | 10/2025 | Imaji | H10N 30/857 |

FOREIGN PATENT DOCUMENTS

| | | | | | |
|---|---|---|---|---|---|
| CN | 108886090 | A | * | 11/2018 | B32B 27/30 |
| CN | 109196673 | A | | 1/2019 | |
| CN | 109219895 | A | | 1/2019 | |
| CN | 119138127 | A | * | 12/2024 | H10N 30/704 |
| DE | 10296795 | T5 | * | 4/2004 | H03H 9/02149 |
| EP | 3442041 | A1 | * | 2/2019 | B32B 27/30 |
| JP | H08125245 | A | * | 5/1996 | H01L 41/09 |
| JP | H09150502 | A | * | 6/1997 | B41J 2/14008 |
| JP | H09183225 | A | * | 7/1997 | B41J 2/14008 |
| JP | H1029303 | A | * | 2/1998 | B41J 2/045 |
| JP | H1034910 | A | * | 2/1998 | B41J 2/015 |
| JP | H1034934 | A | * | 2/1998 | B41J 2/06 |
| JP | H1044398 | A | * | 2/1998 | B41J 2/015 |
| JP | 2939504 | B2 | * | 8/1999 | B41J 2/14008 |
| JP | 2008048379 | A | * | 2/2008 | H03H 9/25 |
| JP | 2010-108490 | A | | 5/2010 | |
| JP | 2010-211482 | A | | 9/2010 | |
| JP | 2011-168688 | A | | 9/2011 | |
| JP | 5121298 | B2 | * | 1/2013 | H03H 9/02574 |
| JP | 2013-162050 | A | | 8/2013 | |
| JP | 5436729 | B1 | * | 3/2014 | H03H 9/0542 |
| JP | 2014143675 | A | * | 8/2014 | H03H 9/0576 |
| JP | 2015186909 | A | | 10/2015 | |
| JP | WO2013161881 | A1 | * | 12/2015 | H03H 9/0576 |
| JP | 2017200230 | A | * | 11/2017 | H03H 9/725 |
| JP | 2017-215319 | A | | 12/2017 | |
| JP | 2017216450 | A | | 12/2017 | |
| JP | 2017216451 | A | | 12/2017 | |
| JP | WO2017170616 | A1 | * | 10/2018 | B32B 27/30 |
| JP | 2019-67908 | A | | 4/2019 | |
| KR | 102165975 | B1 | * | 10/2020 | H10N 30/302 |
| TW | 201631031 | A | | 9/2016 | |
| WO | WO-2013161881 | A1 | * | 10/2013 | H03H 9/0576 |
| WO | WO-2017170616 | A1 | * | 10/2017 | B32B 27/30 |
| WO | WO-2023102349 | A1 | * | 6/2023 | G06N 10/40 |
| WO | WO-2023219090 | A1 | * | 11/2023 | H10N 30/704 |

OTHER PUBLICATIONS

English translation of the Office Action for TW110139472, dated Dec. 28, 2023, 3 pages.
Office Action for KR1020237013771, dated May 6, 2025, 5 pages.
English translation of Office Action for KR1020237013771, dated May 6, 2025, 6 pages.
Extended European Search Report for EP21885946.0, dated Apr. 19, 2024, 8 pages.
Office Action for JP2022-559017, dated Jan. 9, 2024, 2 pages.
English translation of the Office Action for JP2022-559017, dated Jan. 9, 2024, 5 pages.
Office Action for CN202180068139.8, dated Jan. 30, 2026, 7 pages.
English translation of the Office Action for CN202180068139.8, dated Jan. 30, 2026, 10 pages.
Written Opinion for PCT/JP2021/038365 (with English translation), dated Nov. 16, 2021, 8 pages.
Office Action for TW Application No. 110139472, dated Mar. 3, 2022, 5 pages.
English translation of the Office Action for TW Application No. 110139472, dated Mar. 3, 2022, 4 pages.
Office Action for TW Application No. 110139472, dated Sep. 21, 2023, 7 pages.
English translation of the Office Action for TW Application No. 110139472, dated Sep. 21, 2023, 5 pages.
Office Action for CN202180068139.8, dated Jul. 18, 2026, 5 pages.
English translation of Office Action for CN202180068139.8, dated Jul. 18, 2026, 8 pages.

* cited by examiner

TRANSPARENT PIEZOELECTRIC LAMINATED FILM AND TOUCH PANEL

TECHNICAL FIELD

The present invention relates to a transparent piezoelectric laminated film and a touch panel.

BACKGROUND ART

A transparent piezoelectric laminated film generates electricity according to pressure so that a position at which the pressure is applied can be identified. Accordingly, a transparent piezoelectric laminated film can be used for a pressure-sensitive sensor of a touch panel.

As such a transparent piezoelectric laminated film, a transparent piezoelectric laminated sheet containing a vinylidene fluoride-tetrafluoroethylene copolymer, which is a fluororesin, is known (e.g., refer to Patent Document 1). In addition, as the transparent piezoelectric laminated film, an acrylic optical adhesive sheet containing a specific antioxidant, which can be used to bond layers in the transparent piezoelectric laminated film, is known (e.g., refer to Patent Document 2).

CITATION LIST

Patent Literature

Patent Document 1: JP 2010-108490 A
Patent Document 2: JP 2011-168688 A

SUMMARY OF INVENTION

Technical Problem

In the transparent piezoelectric laminated film, the transparent piezoelectric film is usually used by being bonded to another layer by using the transparent optical adhesive sheet as described above. It is preferable that the optical characteristics of the transparent piezoelectric laminated film be substantially constant. However, when a transparent piezoelectric film made of a fluororesin is bonded to the adhesive sheet as described above, the transparent piezoelectric film may develop a yellow color after some time. In particular, under a high-temperature and high-humidity environment, the discoloration of the transparent piezoelectric film is more prominent. In the known techniques described above, there is a need to consider preventing the discoloration of the transparent piezoelectric film made of a fluororesin.

It is an object of one aspect of the present invention to prevent discoloration of a transparent piezoelectric film of a fluororesin in a transparent piezoelectric laminated film including the transparent piezoelectric film made.

Solution to Problem

In order to solve the above problem, a transparent piezoelectric laminated film according to one aspect of the present invention includes a transparent piezoelectric film made of a fluororesin, a transparent coating layer having a thickness of 0.20 μm or more, and a transparent adhesive layer, stacked in this order.

In order to solve the above problem, a touch panel according to one aspect of the present invention includes the above transparent piezoelectric laminated film.

Advantageous Effects of Invention

According to one aspect of the present invention, it is possible to prevent discoloration of a transparent piezoelectric film made of a fluororesin in a transparent piezoelectric laminated film including a transparent piezoelectric film.

DESCRIPTION OF EMBODIMENTS

Configuration

Figure 1:
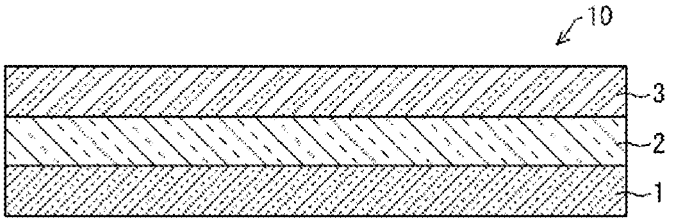
FIG. 1 is a diagram schematically illustrating a layer configuration of a transparent piezoelectric laminated film according to an embodiment of the present invention.

A transparent piezoelectric laminated film according to an embodiment of the present invention includes a transparent piezoelectric film, a transparent coating layer, and a transparent adhesive layer, stacked in this order. In the present embodiment, "stacked in this order" means a state in which the above-described films and layers are arranged in the listed order in a laminate including the above-described films and layers. The above-described films and layers may be stacked in contact with each other or may be stacked with another film or layer interposed therebetween, provided that the effects of the present embodiment are achieved.

Transparent Piezoelectric Film

The transparent piezoelectric film in the present embodiment is made of a fluororesin. In the present embodiment, "made of a fluororesin" means that a fluororesin is the main component in the composition constituting the transparent piezoelectric film, and "fluororesin is the main component" means that fluororesin is the largest component in the resin component in the composition. The content of the fluororesin in the composition may be 51 mass % or more, 80 mass % or more, or 100 mass %.

The term "piezoelectric film" means a film having piezoelectric properties. In addition, in the present embodiment, "transparent" means an optical characteristic of transmitting visible light at a desired ratio or higher according to the application of the transparent piezoelectric laminated film.

The fluororesin in the present embodiment may be any fluororesin that can be used in a piezoelectric film, and may be one kind of fluororesin or multiple kinds of fluororesin. Examples of the fluororesin include a vinylidene fluoride resin, a tetrafluoroethylene resin, and a mixture thereof.

Examples of the vinylidene fluoride resin include a homopolymer of vinylidene fluoride and a copolymer thereof. The content of the structural unit derived from a monomer other than vinylidene fluoride in the copolymer of vinylidene fluoride may be appropriately determined within a range in which characteristics specific to the application of the transparent piezoelectric laminated film can be obtained.

Examples of monomers other than vinylidene fluoride in the copolymer of vinylidene fluoride include hydrocarbon monomers and fluorine compounds. Examples of the hydrocarbon monomer include ethylene and propylene. The fluorine compound is a fluorine compound other than vinylidene fluoride and a fluorine compound having a polymerizable structure. Examples of the fluorine compound include vinyl fluoride, trifluoroethylene, trifluorochloroethylene, tetrafluoroethylene, hexafluoropropylene, and fluoroalkyl vinyl ethers.

Examples of the tetrafluoroethylene resin include a homopolymer of tetrafluoroethylene and a copolymer thereof. Examples of the monomer other than tetrafluoroethylene constituting the structural unit of the copolymer include ethylene, fluoropropylene, fluoroalkyl vinyl ether, perfluoroalkyl vinyl ether, and perfluorodioxole.

The transparent piezoelectric film in the present embodiment may contain various additives as long as the effect of the present embodiment can be achieved. The additive may be one kind of additive or multiple kinds of additives, and examples thereof include a plasticizer, a lubricant, a crosslinking agent, a UV absorber, a pH controlling agent, a stabilizer, an antioxidant, a surfactant, and a pigment.

The thickness of the transparent piezoelectric film in the present embodiment can be appropriately set from a range in which the effect of the present embodiment can be achieved, suited to the application of the transparent piezoelectric laminated film. When the thickness of the transparent piezoelectric film is too thin, the mechanical strength of the film may be insufficient, and when the thickness is too thick, the effect of the film may plateau or the transparency of the film may be insufficient, and it may be difficult to use the transparent piezoelectric film in optical applications.

The thickness of the transparent piezoelectric film is preferably 10 μm or more, more preferably 20 μm or more, and still more preferably 30 μm or more from the viewpoint of achieving sufficient piezoelectric properties and mechanical strength. Furthermore, the thickness of the transparent piezoelectric film is preferably 200 μm or less, more preferably 120 μm or less, and still more preferably 80 μm or less from the viewpoint of achieving sufficient transparency and piezoelectric properties.

The piezoelectric characteristics of the transparent piezoelectric film in the present embodiment can be appropriately set from a range in which the effects of the present embodiment can be achieved, according to the application of the transparent piezoelectric laminated film. If the piezoelectric characteristics are too low, functionality as a piezoelectric material may be insufficient. From the viewpoint of achieving sufficient piezoelectric characteristics, when the transparent piezoelectric laminated film is a touch panel, for example, the piezoelectric characteristics of the transparent piezoelectric film have a piezoelectric constant $d_{33}$ of preferably 6 pC/N or more, more preferably 10 pC/N or more, and even more preferably 12 pC/N or more. The upper limit of the piezoelectric characteristics is not limited, but in the above case, the piezoelectric constant $d_{33}$ may be 30 pC/N or less from the viewpoint of sufficiently obtaining the desired effect.

The transparent piezoelectric film in the present embodiment can be produced by, for example, subjecting a fluororesin sheet as described in Examples to stretching and polarization treatment. In the production, sufficiently thinning the transparent piezoelectric film to achieve the above-described thickness is preferable from the viewpoint of enhancing the transparency of the transparent piezoelectric film. In addition, when roll stretching is performed in the production, it is preferable to use a mirror-finished roll or to use a protective film (e.g., refer to JP 2019-67908 A) from the viewpoint of preventing scratches on the surface of the transparent piezoelectric film and enhancing the transparency of the transparent piezoelectric film.

Transparent Coating Layer

The transparent coating layer in the present embodiment is located between the transparent piezoelectric film and the transparent adhesive layer. The transparent coating layer may be any layer that is transparent and has inertness that does not substantially affect the optical characteristics of the transparent piezoelectric film. The transparent coating layer may be disposed on only one surface side or on both surface sides of the transparent piezoelectric film. When the transparent coating layer is formed on both surfaces of the transparent piezoelectric film, the two transparent coating layers may have the same composition, thickness, and physical properties, or may have different compositions, thicknesses, and physical properties. When the transparent coating layer is formed on both surfaces of the transparent piezoelectric film, it is preferable that at least one of the transparent coating layers, more preferably both of the transparent coating layers, have a preferable configuration for the transparent coating layer to be described below. The transparent coating layer is preferably disposed adjacent to the transparent piezoelectric film in the thickness direction of the transparent piezoelectric laminated film from the viewpoint of preventing color development of the transparent piezoelectric film described above.

The thickness of the transparent coating layer in the present embodiment can be appropriately set within a range in which the effects of the present embodiment can be achieved. When the transparent coating layer is too thin, the transparent coating layer may not sufficiently cover the surface of the transparent piezoelectric film, and a portion of the transparent piezoelectric film may be exposed from the transparent coating layer. If the transparent coating layer is too thick, the piezoelectric properties of the transparent piezoelectric laminated film may be insufficient.

The thickness of the transparent coating layer is preferably 0.20 μm or more, more preferably 0.25 μm or more, and even more preferably 0.30 μm or more from the viewpoint of sufficiently coating the surface of the transparent piezoelectric film. In addition, the thickness of the transparent coating layer is preferably 4.0 μm or less, more preferably 3.5 μm or less, and even more preferably 3.0 μm or less, from the viewpoint of sufficiently reflecting the piezoelectric characteristics of the transparent piezoelectric film.

The transparent coating layer may be a transparent surface protective layer for scratch prevention, also known as a hard coat layer. The material of the transparent coating layer can be selected from any material that can be used for a piezoelectric film as long as it has the above transparency and the above inertness with respect to the transparent piezoelectric film. The material may be an inorganic material or an organic material, and one or more kinds thereof may be used. Further, the material of the coating layer may be the material of the hard coat layer. Examples of the material include a melamine resin, a urethane resin, a (meth)acrylic acid ester resin, a silane compound, and a metal oxide. The term “(meth)acrylic acid” is a generic term for acrylic acid and methacrylic acid, and means one or both of them.

It is preferable that the material of the transparent coating layer be a (meth)acrylic acid ester resin, that is, the transparent coating layer be made of a (meth)acrylic acid ester resin, from the viewpoint of achieving sufficient transparency and a sufficient barrier function of the transparent piezoelectric film, and due to the larger number of types of materials that can be used and low raw material cost. The material of the transparent coating layer may include other materials required to form the transparent coating layer. As a material for a transparent coating layer made of a (meth) acrylic acid ester resin, a composition obtained by mixing an initiator, an oligomer, a monomer, and other components may be generally used. In this case, the physical properties of the transparent coating layer are mainly determined by the oligomer and the monomer. Examples of the oligomer include a monofunctional or a polyfunctional (meth)acrylate. Examples of the monomer include urethane (meth) acrylate, epoxy (meth)acrylate, and polyester (meth)acrylate.

The transparent coating layer may have various functions within a range in which the effect of the present embodiment is achieved. The material of the transparent coating layer may further contain a material for achieving an optional function as another component. Examples of such a material include an optical modifier for controlling the refractive index of the transparent coating layer, and an antistatic agent. Examples of the optical modifier include hollow silica-based fine particles, a silane coupling agent, silicon oxide, aluminum oxide, titanium oxide, zirconium oxide, zinc oxide, and tin oxide. Examples of the antistatic agent include a surfactant, antimony pentoxide, indium tin oxide, and a conductive polymer.

Transparent Adhesive Layer

The transparent adhesive layer in the present embodiment is a transparent layer formed on the transparent coating layer side. The transparent adhesive layer has adhesiveness that achieves adhesion between the laminated film of the transparent piezoelectric film and the transparent coating layer.

The material of the transparent adhesive layer can be selected from all materials that can be used for transparent laminated films. The material may be an inorganic material or an organic material, and one or more kinds thereof may be used. Examples of the material include an acrylic resin-based adhesive agent, a rubber-based adhesive agent, a silicone-based adhesive agent, a polyester-based adhesive agent, a polyurethane-based adhesive agent, a polyamide-based adhesive agent, an epoxy resin-based adhesive agent, a polyvinyl alkyl ether-based adhesive agent, and a fluororesin-based adhesive agent.

Among them, the acrylic resin-based adhesive has excellent transparency and allows easy control of the molecular weight and crosslinking point by polymerization. Further, many kinds of monomers can be used as the raw material, and the glass transition point can be freely controlled. An adhesive for a touch panel is generally required to have various characteristics such as transparency, weather resistance, and durability. Therefore, the acrylic resin-based adhesive having such preferable characteristics is suitable as a material for the transparent adhesive layer in the present embodiment.

The acrylic resin-based adhesive is formed of a polymer of an acrylic acid-based monomer such as an elastomer. The monomer from which the structural unit of the acrylic resin-based adhesive is derived includes a main monomer that contributes to the basic performance of the adhesive, and may further include a comonomer for enhancing function and a functional group-containing monomer for introducing a crosslinking point. Examples of the primary monomer include ethyl acrylate, butyl acrylate, 2-ethylhexyl acrylate, and isononyl acrylate. Examples of the comonomer for, for example, increasing cohesive force of the adhesive include vinyl acetate, acrylonitrile, acrylamide, styrene, methyl methacrylate, and methyl acrylate. Examples of the functional group-containing monomer include acrylic acid, hydroxyethyl acrylate, acrylamide, and glycidyl methacrylate.

Examples of the silicone-based adhesive include the LUMISIL series ("LUMISIL" is a registered trademark of Wacker Chemie AG), which are ultraviolet-curable optical adhesive silicones, and the ISR-SOC series, which are silicone highly-transparent adhesive sheets.

The acrylic resin-based adhesive is excellent in various characteristics such as transparency and adhesiveness, but may cause yellowing of the transparent piezoelectric film when in contact with the transparent piezoelectric film. In the present embodiment, even when the transparent adhesive layer is an acrylic resin-based adhesive, the transparent coating layer described above is interposed between the transparent adhesive layer and the transparent piezoelectric film. Therefore, yellowing of the transparent piezoelectric film over time, which is thought to be caused by an acrylic resin-based adhesive, is prevented.

One of indexes for determining the physical properties of the transparent adhesive of the transparent adhesive layer is a glass transition temperature. The glass transition temperature is the temperature at which the adhesive transitions from a rubbery state to a glassy state (or vice versa). In the acrylic resin-based adhesive, the temperature range in which adhesiveness is exhibited is generally determined by the glass transition temperature of a base polymer (e.g., a polymer formed of the above-described main monomer). The glass transition temperature of the transparent adhesive layer may be appropriately determined depending on the desired adhesiveness and the temperature at which the adhesiveness is exhibited. The adhesiveness of the adhesive can usually be increased through the introduction of crosslinking. Additionally, the glass transition temperature is changed and generally increased through the introduction of crosslinking. The glass transition temperature can be appropriately adjusted by changing the molecular structure of the adhesive or by mixing two or more resins. The glass transition temperature of the transparent adhesive layer can be measured by a known method capable of measuring the glass transition temperature of individual layers in a laminated film.

When the thickness of the transparent adhesive layer is too thin, the adhesive force may be insufficient. When the thickness is too thick, the transparent piezoelectric laminated film may have insufficient piezoelectric characteristics. From the viewpoint of achieving sufficient adhesive force, the thickness of the transparent adhesive layer is preferably 25 μm or more, more preferably 30 μm or more, and even more preferably 35 μm or more. Furthermore, the thickness of the transparent adhesive layer is preferably 200 μm or less, more preferably 150 μm or less, and even more preferably 100 μm or less from the viewpoint of achieving sufficient piezoelectric characteristics in the transparent piezoelectric laminated film.

Other Layer Configurations

The transparent piezoelectric laminated film of the present embodiment may further have a configuration other than that described above, as long as the effect of the present embodiment is obtained. Such other configurations may be used singularly or in conjunction, and examples thereof include a peelable release layer that is in contact with the transparent adhesive layer, an optical adjustment layer (index matching layer), and a conductive layer. The optical adjustment layer can be formed using the material of the transparent coating layer, within a range in which desired performance is exhibited.

The thickness of each layer constituting the transparent piezoelectric laminated film can be measured by embedding the transparent piezoelectric laminated film in an epoxy resin, cutting the epoxy resin mass to expose a cross section of the transparent piezoelectric laminated film, and observing the cross section with a scanning electron microscope. The thickness of the layer may be a representative value of thicknesses of the layer, or may be an average value of a plurality of any measured values, a maximum value of the measured values, or a minimum value of the measured values.

Physical Properties

The transparent piezoelectric laminated film of the present embodiment is preferably sufficiently transparent from the viewpoint of achieving sufficient light transmittance. For example, the total light transmittance of the transparent piezoelectric laminated film can be appropriately set depending on the application of the transparent piezoelectric laminated film. The total light transmittance of the transparent piezoelectric laminated film is preferably 80% or more when the film is used as a pressure-sensitive sensor of a touch panel, and more preferably 83% or more when used as a pressure-sensitive sensor disposed on the surface side of a display in a touch panel. The total light transmittance can be measured by the known method described in JIS K7361 using, for example, a haze meter.

Similarly to the total light transmittance, the haze value of the transparent piezoelectric laminated film can be appropriately set depending on the application of the transparent piezoelectric laminated film. The haze value of the transparent piezoelectric laminated film is preferably 1.5 or less when the film is used as a pressure-sensitive sensor of a touch panel, and more preferably 1.0 or less when used as a pressure-sensitive sensor disposed on the front surface side of a display in a touch panel. The haze value can be measured by the known method described in JIS K 7136 using, for example, a haze meter.

The transparent piezoelectric laminated film may further include other layers such as an electrode layer for use. The transparency of the transparent piezoelectric laminated film can be set in consideration of the configuration in such use, but is generally equivalent to the transparency of the transparent piezoelectric film. Therefore, the transparency of the transparent piezoelectric laminated film can be appropriately set from the transparency of the transparent piezoelectric film, provided that the influence of the presence of another layer or the like is taken into consideration. The influence of the other layer or the like on the transparency may be determined by, for example, directly determining the transparency of the other layer or the like, or may be determined from the difference between the transparency of the transparent piezoelectric laminated film and the transparency of the transparent piezoelectric film.

Furthermore, it is preferable that the transparent piezoelectric laminated film of the present embodiment not discolor from the viewpoint of achieving stable translucency. Such discoloration resistance can also be appropriately set depending on the application of the transparent piezoelectric laminated film.

When the transparent piezoelectric film and the transparent adhesive layer are in direct contact with each other, the transparent piezoelectric film may turn yellow. The degree of yellowing can be represented by the value ΔE in an L*a*b* color system. For example, a larger difference between the ΔE values before and after the transparent piezoelectric film is left in a predetermined environment for a predetermined time indicates more significant yellowing of the transparent piezoelectric film. A smaller difference between the ΔE values indicates more suppressed yellowing of the transparent piezoelectric film. The desired environment, desired time, and difference in optical characteristic values such as the ΔE values may be appropriately determined depending on the application of the transparent piezoelectric laminated film. The color difference as described above can be measured by the known method described in JIS Z8722 using a spectrochromatometer or a spectrocolorimeter. In the present embodiment, the ΔE value is calculated by the following equation. ΔE represents color difference. ΔL* represents the difference between L* values before and after the transparent piezoelectric film is left, Δa* represents the difference between a* values before and after the transparent piezoelectric film is left, and Δb* represents the difference between b* values before and after the transparent piezoelectric film is left.

$$\Delta E = \{(\Delta L^*)^2 + (\Delta a^*)^2 + (\Delta b^*)^2\}^{0.5} \quad \text{[Equation]}$$

The optical characteristics as described above in the transparent piezoelectric laminated film of the present embodiment may be measured under an appropriate environment according to the application of the film. For example, in applications such as a liquid crystal touch panel of a car navigation system or a smartphone, discoloration resistance under a specific high-temperature and high-humidity environment is required. From the viewpoint of stabilizing optical characteristics in such applications, the L* value of the transparent piezoelectric laminated film left in an environment of 85° C. and 85% RH for 300 hours is preferably 85 or more, the a* value is preferably 3 or less, and the b* value is preferably 4 or less. In addition, if the ΔE when the transparent piezoelectric laminated film is left for 300 hours in a high-temperature and high-humidity environment is preferably 4.0 or less, more preferably 3.5 or less, and even more preferably 2.5 or less, the transparent piezoelectric laminated film is determined to have sufficient durability in a high-temperature and high-humidity environment for use in a touch panel.

In the embodiment of the present invention, the physical property value of a laminate of the transparent piezoelectric film and the transparent coating layer may be used instead of the physical property value of the transparent piezoelectric laminated film. The physical property value of the transparent piezoelectric laminated film can be practically set according to the application. The physical property value of the laminate need only be a value obtained by adding the influence of the transparent adhesive layer to the physical property value of the transparent piezoelectric laminated film depending on the application, and may be the same as the physical property value of the transparent piezoelectric laminated film or may be a different value obtained by adding the influence of the transparent adhesive layer depending on the physical properties. Similarly, instead of the physical property value of the transparent piezoelectric laminated film, the physical property value of the transparent piezoelectric film alone may be used, and the physical property value of the transparent piezoelectric film alone may be determined in consideration of the influence of the transparent coating layer and the transparent adhesive layer. In addition, when the transparent piezoelectric laminated film of the present embodiment further has a configuration other than that of the transparent piezoelectric film, the transparent coating layer, and the transparent adhesive layer, the measurement target to determine the physical property value may be selected according to the application of the transparent piezoelectric laminated film. For example, when a transparent piezoelectric laminated film including a peelable release layer that is in contact with the transparent adhesive layer is put to practical use after the release layer is peeled off, the physical property value may be measured after the release layer has been peeled off from the transparent piezoelectric laminated film.

Production Method

The transparent piezoelectric laminated film of the present embodiment can be produced in the same manner as a known transparent piezoelectric laminated film, except that the above-described film is used and the above-described layer is formed. For example, the transparent piezoelectric laminated film may be produced by stacking a transparent piezoelectric film, a transparent coating layer, and a transparent adhesive layer in this order. Alternatively, the transparent piezoelectric laminated film may be produced by forming the transparent coating layer on the surface of the transparent piezoelectric film and forming the transparent adhesive layer on the surface of the transparent coating layer. Alternatively, the transparent piezoelectric laminated film may be produced by forming the transparent coating layer on the surface of the transparent piezoelectric film and bonding the transparent adhesive layer (formed on a release film, for example) to the surface of the transparent coating layer.

The transparent coating layer can be produced by performing a step of applying a coating material for forming the transparent coating layer to the transparent piezoelectric film and a step of solidifying the coating film formed in the applying step. The step of applying the coating material can be performed by a known coating method. Examples of the coating method include spray coating, roll coating, die coating, air knife coating, blade coating, spin coating, reverse coating, gravure coating, and vapor deposition. The thickness of the coating film can be appropriately adjusted based on the number of times the coating film is applied or the viscosity of the coating material.

The step of solidifying can be performed by a known method of solidifying the coating film of the coating material. Examples of the solidification method include drying, and curing by polymerization by heating or light irradiation. Of these methods, curing by polymerization by light irradiation such as ultraviolet (UV) irradiation is preferable from the viewpoint of being a suitable method for processing on the surface of an object and preventing thermal deformation of individual layers. For example, the transparent coating layer can be formed by applying the above coating material, removing the solvent in the coating material by heating, and then curing the coating film by UV irradiation. When the transparent coating layer is formed by UV irradiation, the UV irradiation is preferably performed in an inert atmosphere from the viewpoint of preventing curing inhibition due to oxygen.

The coating material for the transparent coating layer may contain a polymer, may contain a monomer, or may contain both of these. In addition, in the coating material, the polymer may contain a crosslinked structure that causes curing, or may contain a low molecular weight compound having a plurality of crosslinked structures. Further, the coating material may contain, as appropriate and necessary, an additive for solidification, such as a polymerization initiator for causing the polymerization reaction.

The transparent coating layer may be produced simultaneously with the transparent piezoelectric film by co-extruding the transparent piezoelectric film and the transparent coating layer.

The transparent adhesive layer can be prepared by applying the transparent adhesive to the transparent coating layer. Such coating can be carried out by a known coating method as described above. If necessary, the coating film formed by applying the transparent adhesive may be solidified. This solidification can be performed by drying by heating or the like. Alternatively, as described above, the transparent adhesive layer may be produced by bonding a film of the transparent adhesive that has already been produced to the transparent coating layer.

Hereinafter, an embodiment of the present invention will be described with reference to the drawings. As illustrated in FIG. 1, a transparent piezoelectric laminated film 10 according to an embodiment of the present invention includes a transparent piezoelectric film 1, a transparent coating layer 2, and a transparent adhesive layer 3 directly stacked in this order.

The transparent piezoelectric film 1 is made of a fluororesin as described above, and may be a film obtained by, for example, subjecting a fluororesin material to stretching and polarization treatment. The transparent coating layer 2 is made of, for example, the above-described (meth)acrylic acid ester resin, and is stacked on one surface of the transparent piezoelectric film 1. The transparent adhesive layer 3 is, for example, the acrylic resin-based adhesive described above, and is stacked on the surface of the transparent coating layer 2 on a side opposite to the transparent piezoelectric film 1. The transparent piezoelectric laminated film 10 is used in a pressure-sensitive sensor such as a touch panel by being bonded to another component via the transparent adhesive layer 3.

Figure 2:
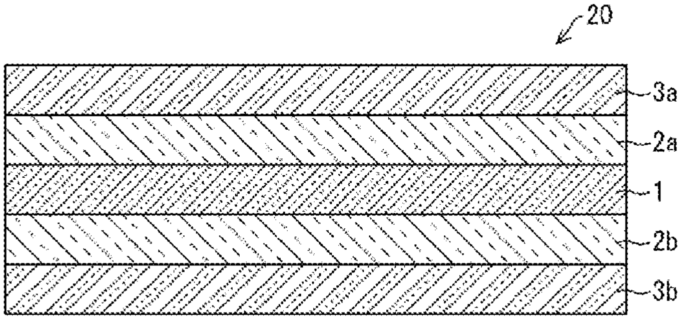
FIG. 2 is a diagram schematically illustrating a layer configuration of a transparent piezoelectric laminated film according to another embodiment of the present invention.

As illustrated in FIG. 2, a transparent piezoelectric laminated film 20 according to another embodiment of the present invention includes the transparent piezoelectric film 1, the transparent coating layer 2, and the transparent adhesive layer 3 directly stacked in this order. In the transparent piezoelectric laminated film 20, the transparent coating layer 2 and the transparent adhesive layer 3 are disposed on both sides of the transparent piezoelectric film 1. That is, a transparent coating layer 2*a* is stacked on one surface of the transparent piezoelectric film 1, and a transparent coating layer 2*b* is stacked on the other surface of the transparent piezoelectric film 1. Further, a transparent adhesive layer 3*a* is stacked on the surface of the transparent coating layer 2*a*, and a transparent adhesive layer 3*b* is stacked on the surface of the transparent coating layer 2*b*. Similarly to the transparent piezoelectric laminated film 10, the transparent piezoelectric laminated film 20 is also used as a part of a laminated structure in a pressure-sensitive sensor such as a touch panel by bonding each of the transparent adhesive layers 3*a* and 3*b* to another layer.

Touch Panel

Figure 3:
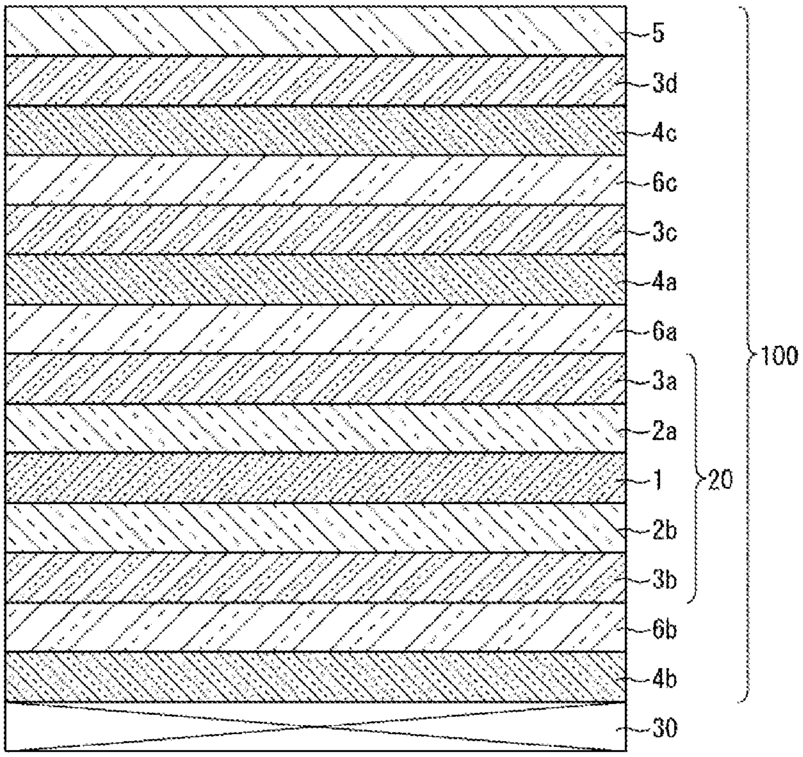
FIG. 3 is a diagram schematically illustrating a layer configuration of a touch panel according to an embodiment of the present invention.

A touch panel according to an embodiment of the present invention includes the above-described transparent piezoelectric laminated film according to one embodiment of the present invention. The location and quantity of the transparent piezoelectric laminated films in the touch panel can be appropriately set according to the intended use or intended function of the touch panel. FIG. 3 is a view schematically illustrating an example of a layer configuration in the touch panel according to the embodiment of the present invention.

As illustrated in FIG. 3, the touch panel 100 has a configuration in which the transparent piezoelectric laminated film 20 illustrated in FIG. 2 is sandwiched between a transparent electrode 4*b* and a cover glass 5. Between the transparent piezoelectric laminated film 20 and the cover glass 5, a transparent substrate 6*a*, a transparent electrode 4*a*, a transparent adhesive layer 3*c*, a transparent substrate 6*c*, a transparent electrode 4*c*, and a transparent adhesive layer 3*d* are stacked in this order from the transparent piezoelectric laminated film 20 toward the cover glass 5. A transparent substrate 6*b* is disposed between the transparent piezoelectric laminated film 20 and the transparent electrode 4*b*. As described above, the touch panel 100 is configured by stacking the transparent electrode 4*b*, the transparent piezoelectric laminated film 20, and the cover glass 5 in this order. When the touch panel 100 is put into practical use, the surface of the touch panel 100 on the side of the transparent electrode 4*b* can be disposed overlapping the surface of the display 30, but no limitation is intended.

The transparent piezoelectric laminated film 20 and the cover glass 5 are bonded to each other by the transparent adhesive layer 3*a* with the transparent adhesive layers 3*c* and 3*d*, the transparent electrodes 4*a* and 4*c*, and the transparent substrates 6*a* and 6*c* interposed therebetween, and the transparent piezoelectric laminated film 20 and the transparent electrode 4*b* are bonded to each other by the transparent adhesive layer 3*b* with the transparent substrate 6*b* interposed therebetween. In addition, a display panel such as an organic EL display panel or a liquid crystal display panel, that is, the display 30 may be disposed on the opposite side of the transparent piezoelectric laminated film 20 in the stacking direction of the transparent electrode 4*b*. Since a known display panel in the related art can be employed as the display 30, a detailed description of the configuration of the display 30 will be omitted in the present specification.

The transparent electrodes 4*a*, 4*b*, and 4*c* may be formed on the transparent substrates 6*a*, 6*b*, and 6*c*, respectively, and bonded to desired layers in the touch panel 100 together with the transparent substrates 6*a*, 6*b*, and 6*c*. Alternatively, the transparent electrodes 4*a*, 4*b*, and 4*c* may be formed directly on the surfaces of other adjacent layers in the stacking direction and bonded by the transparent adhesive layers 3*a*, 3*b*, 3*c*, or 3*d*.

As the transparent electrodes 4*a*, 4*b*, and 4*c*, known transparent electrodes that can be used in a touch panel can be employed. More specifically, the transparent electrodes 4*a*, 4*b*, and 4*c* may be substantially transparent planar electrodes, may be conductive thin films having a pattern, or may have a planar structure formed of an extremely thin conductive wire. The material constituting the transparent electrodes 4*a*, 4*b*, and 4*c* is not limited, and metal oxides of at least one metal selected from the group consisting of In, Sn, Zn, Ga, Sb, Ti, Si, Zr, Mg, Al, Au, Ag, Cu, Pd, and W are preferably used. The metal oxide may further contain a metal atom selected from the group described above, if necessary. As the metal oxide, an oxide such as indium-tin composite oxide (ITO) or antimony-tin composite oxide (ATO) is preferably used, and ITO is particularly preferably used. Examples of other representative materials for the transparent electrodes 4*a*, 4*b*, and 4*c* include silver nanowire, silver mesh, copper mesh, graphene, and carbon nanotube. For the transparent substrates 6*a*, 6*b*, and 6*c*, a known transparent film that can be used as a base for supporting the transparent electrodes 4*a*, 4*b*, and 4*c* can be employed. The material forming the transparent substrates 6*a*, 6*b*, and 6*c* is not limited, and polyethylene terephthalate (PET), polycarbonate (PC) and a cycloolefin polymer (COP) are preferably used.

The cover glass 5 is a cover glass for a touch panel. The cover glass need only be a sheet-like light transmitting member for a touch panel, and may be a glass plate such as the cover glass 5 or a transparent resin sheet.

The touch panel in the embodiment of the present invention may further include other components, as long as the effects of the present embodiment can be achieved.

In addition, the touch panel according to the embodiment of the present invention may include the transparent piezoelectric laminated film according to the embodiment of the present invention in the laminated structure. The position of the transparent piezoelectric laminated film in the touch panel in the stacking direction may be appropriately set within a range in which the effect of the embodiment of the present invention can be achieved.

In addition, the touch panel according to the embodiment of the present invention may have a configuration in which the transparent piezoelectric laminated film according to the present embodiment is appropriately added to a laminated structure in a known touch panel, such as a GFF type panel or a GF2 type panel. In this case, a transparent electrode layer used for detecting pressure and a position sensor used for detecting a position may be directly stacked on the transparent piezoelectric laminated film of the present embodiment, or may be bonded thereto via an adhesive layer. The touch panel having such a configuration can further exhibit a function derived from the transparent piezoelectric laminated film in addition to the functions of a known touch panel. For example, the touch panel can include both a position sensor and a pressure sensor in a transparent laminated structure.

In the production of the touch panel of the present embodiment, the transparent adhesive layer may be formed not only on the transparent coating layer but also on another layer that adheres to the transparent coating layer via the transparent adhesive layer. In this case, the transparent adhesive layer may or may not be present on the transparent coating layer side.

Effect

As described above, the transparent piezoelectric laminated film according to the embodiment of the present invention may include the transparent piezoelectric film made of a fluororesin, the transparent coating layer, and the transparent adhesive layer. The transparent piezoelectric laminated film having the above-described configuration achieves sufficient piezoelectric properties by the transparent piezoelectric film, and adhesiveness derived from the transparent adhesive layer, can minimize discoloration of the transparent piezoelectric film over time, and can provide sufficient transparency over a long period of time.

Since the transparent piezoelectric laminated film provides stable transparency as described above and can be formed only of an organic layer such as a resin, the overall layer thickness of the pressure-sensitive sensor having sufficient transparency can be further reduced. Therefore, the transparent piezoelectric laminated film can be disposed as a pressure-sensitive sensor on the surface (image display surface) side of the display panel. Therefore, the layer configuration of the touch panel can be simplified over that in the related art, or the overall layer thickness of the touch panel can be reduced, and the degree of freedom in terms of the quantity and location of transparent piezoelectric laminated films to be arranged in the touch panel can be increased.

SUMMARY

As is clear from the above description, the transparent piezoelectric laminated film according to the embodiment of the present invention is formed by stacking the transparent piezoelectric film made of a fluororesin, the transparent coating layer having a thickness of 0.20 μm or more, and the transparent adhesive layer in this order. In addition, the touch panel according to the embodiment of the present invention includes the transparent piezoelectric laminated film. Therefore, both the transparent piezoelectric laminated film and the touch panel can prevent discoloration of the transparent piezoelectric film in the transparent piezoelectric laminated film including the transparent piezoelectric film made of a fluororesin.

In the embodiment of the present invention, the transparent coating layer has a thickness of 4.0 μm or less, which is more effective from the viewpoint of suppressing discoloration of the transparent piezoelectric film and achieving sufficient piezoelectric characteristics.

In the embodiment of the present invention, the transparent coating layer is made of a (meth)acrylic acid ester resin, which is more effective from the viewpoint of achieving sufficient transparency of the transparent piezoelectric laminated film and suppressing discoloration of the transparent piezoelectric film.

In the embodiment of the present invention, the transparent adhesive layer contains an acrylic resin-based adhesive, which is more effective from the viewpoint of achieving sufficient adhesion strength of the transparent coating layer to the adhesion surface and from the viewpoint of cost reduction.

In the embodiment of the present invention, the value ΔE when the transparent piezoelectric laminated film is left in an environment of 85° C. and 85% RH for 300 hours is 4.0 or less, which is more effective from the viewpoint of achieving sufficient durability in a high-temperature and high-humidity environment in a touch panel application.

In the embodiment of the present invention, the transparent coating layer and the transparent adhesive layer are disposed on both surface sides of the transparent piezoelectric film, which is more effective from the viewpoint of obtaining a transparent piezoelectric laminated film having transparent adhesive layers on both surface sides and in which each of the transparent adhesive layers is bonded to another layer.

The present invention is not limited to each embodiment described above, and may be variously altered within the scope indicated in the claims. Embodiments obtained by appropriately combining technical means disclosed in different embodiments are also included in the technical scope of the present invention.

EXAMPLES

Example 1

A polyvinylidene fluoride sheet having a thickness of 140 μm (available from Kureha Corporation) was stretched to a stretching ratio of 4.2 times. A direct-current voltage was applied to the stretched sheet while the voltage was increased from 0 KV to 11.8 kV to perform a polarization treatment. Thus, a transparent piezoelectric film having a thickness of 40 μm was obtained.

Next, the obtained transparent piezoelectric film was heat-treated at 130° C. for 1 minute. A hard coating agent ("BS CH271" (available from Arakawa Chemical Industries, Ltd.)) was applied to one surface of the heat-treated transparent piezoelectric film with a bar coater and dried at 80° C. for 2 minutes. The hard coating agent is an acrylic hard coating agent and has UV curability.

Next, the dried coating film of the hard coating agent was irradiated with UV at an integrated light amount of 400 mJ/cm$^2$ using the UV irradiation device CSOT-40 (available from GS Yuasa Corporation). Thus, a film having a transparent coating layer with the thickness shown in the table below on one side was obtained. The same operation was performed on the opposite surface of the transparent piezoelectric film to obtain a transparent coating film in which the transparent coating layer was present on both surfaces of the transparent piezoelectric film.

Next, an acrylic optical adhesive sheet ("LUCIACS CS9827US" available from NITTO DENKO CORPORATION; "LUCIACS" is a registered trade mark of the same company) was bonded to both surfaces of the transparent coating film using an MRK-650Y Halder Laminator (available from MCK Co., Ltd.) under conditions of bonding pressure of 0.2 MPa and a bonding speed of 1.0 m/min. Thus, a transparent piezoelectric laminated film was obtained. The transparent piezoelectric laminated film using this optical adhesive sheet will also be referred to as "acrylic 1".

Examples 2 to 4, Comparative Example 4

Transparent piezoelectric laminated films in which the transparent coating layer has different thicknesses were obtained in the same manner as in Example 1 except that the transparent coating layers were formed so as to have thicknesses shown in the table described below.

Example 5

A transparent piezoelectric laminated film was obtained in the same manner as in Example 1 except that the optical adhesive sheet was changed to another acrylic optical adhesive sheet ("NNX75M", available from Gunze Limited). The transparent piezoelectric laminated film using this optical adhesive sheet will also be referred to as "acrylic 2".

Example 6

The transparent piezoelectric laminated film of acrylic 1 was obtained in the same manner as in Example 1 except that the DC voltage in the polarization treatment was increased from 0 kV to 11.0 KV instead of being increased from 0 kV to 11.8 kV, and that the hard coating agent was changed to "Lioduras TYAB-M101" (available from TOYOCHEM CO., LTD.; "Lioduras" is a registered trade mark of TOYO INK SC HOLDINGS CO., LTD.) to form a transparent coating layer having the thickness shown in the table described below.

Examples 7 and 8

Transparent piezoelectric laminated films in which the thicknesses of the transparent coating layers disposed on both surfaces of the transparent piezoelectric film were different from each other were obtained in the same manner as in Example 1 except that a transparent coating layer having a thickness of 1.0 μm was formed on one surface of the transparent piezoelectric film, and a transparent coating layer having a thickness of 4.0 μm was formed on the opposite surface side in Example 7 and a transparent coating layer having a thickness of 10.0 μm was formed on the opposite surface side in Example 8.

Comparative Examples 1 to 3

Transparent piezoelectric laminated films as comparative examples were obtained in the same manner as in Examples 1, 5, and 6, respectively, except that the hard coating agent was not applied.

Evaluation

Thickness of Transparent Coating Layer

Each of the transparent piezoelectric laminated films of the Examples and Comparative Example 4 was embedded in an epoxy resin, and the epoxy resin mass was cut so that a cross section of the transparent piezoelectric laminated film was exposed. The exposed cross-section of the transparent piezoelectric laminated film was observed using a scanning electron microscope ("SU3800", available from Hitachi High-Technologies Corporation) under the conditions of an acceleration voltage of 3.0 KV and a magnification of 50,000 times to measure the thickness of the transparent coating layer in the transparent piezoelectric laminated film.

In the measurement of the thickness of the transparent coating layer, the thicknesses at two portions of the transparent coating layer were measured, and the average value thereof was defined as the thickness of the transparent coating layer. Under the above observation conditions, the interface of the transparent coating layer was observed as substantially smooth lines, and the distance between the lines was measured in the measurement of the thickness of the transparent coating layer.

Piezoelectric Constant $d_{33}$ Value

The piezoelectric constant $d_{33}$ of each of the transparent coating films of the Examples and Comparative Example 4 and the transparent piezoelectric films of Comparative Examples 1 to 3 was measured by using a piezoelectric constant measuring device ("Piezometer System PM300", manufactured by Piezotest Pte Ltd) by clipping a sample at 0.2 N and reading the generated charge when a force of 0.15 N and 110 Hz was applied. Although the measured value of the piezoelectric constant $d_{33}$ is a positive value or a negative value depending on whether the front or back of the film is to be measured, the absolute value is described herein. When the piezoelectric constant $d_{33}$ value is 6 pC/N or more, it can be determined that there are no problems in practical use of the touch panel.

Since the influence of the transparent piezoelectric film on the piezoelectric characteristics of the transparent piezoelectric laminated film is the strongest, and the influence of the transparent adhesive layer on the piezoelectric characteristics is sufficiently smaller than the influence of the transparent piezoelectric film and the transparent coating layer, the piezoelectric characteristics of the transparent piezoelectric laminated film can be verified by the piezoelectric characteristics of the transparent coating film.

Total Light Transmittance

The total light transmittance of each of the transparent coating films used in the Examples and Comparative Example 4 and the transparent piezoelectric films used in Comparative Examples 1 to 3 was measured using a haze meter ("NDH7700SP II", available from Nippon Denshoku Industries Co., Ltd.) based on the method described in JIS K7361-1. When the total light transmittance is 80% or more, it can be determined that there are no problems in practical use of the touch panel.

Since the influence of the transparent adhesive layer on the light transmittance of the transparent piezoelectric laminated film is sufficiently smaller than the influence of the transparent piezoelectric film and the transparent coating layer, the light transmittance of the transparent piezoelectric laminated film can be verified by the light transmittance of the transparent coating film.

Haze Value

The haze value of each of the transparent coating films used in Examples and Comparative Example 4 and the transparent piezoelectric films used in Comparative Examples 1 to 3 was measured using a haze meter ("NDH7700SP II", available from Nippon Denshoku Industries Co., Ltd.) based on the method described in JIS K7136. When the haze value is 1.5 or less, it can be determined that there is no problems in practical use of the touch panel.

L* Value, a* Value, b* Value

The L* value, at value, and b* value in the L*a*b* color system of each of the transparent coating films used in the Examples and Comparative Example 4 and the transparent piezoelectric films used in Comparative Examples 1 to 3 were measured using a spectrocolorimeter ("SE7700", available from Nippon Denshoku Industries Co., Ltd.) in accordance with the method described in JIS Z8722. When the L* value is 85 or more, it can be determined that there are no problems in practical use of the touch panel. When the a* value is 3 or less, it can be determined that there are no problems in practical use of the touch panel. When the b* value is 4 or less, it can be determined that there are no problems in practical use of the touch panel.

High-Temperature and High-Humidity Environment Test

Each of the transparent piezoelectric laminated films of the Examples and Comparative Examples was placed in a thermo-hygrostat controlled to an 85° C. and 85% RH atmosphere ("Econas LH34 14M", available from NAGANO SCIENCE Co., Ltd.), and the L* value, a* value, and b* value before and after a predetermined time were measured by the above-described method. The value of ΔE after a predetermined time in the atmosphere was calculated by the following equation. In the following equation, ΔE represents a color difference after a predetermined time, and ΔL*, Δa*, and Δb* represent differences in the L*, a*, and b* values before and after a predetermined time in a high-temperature and high-humidity environment, respectively. The high-temperature and high-humidity environment test was performed using a transparent piezoelectric laminated film having a configuration in which a first release layer, a first transparent adhesive layer, a first transparent coating layer, a transparent piezoelectric film, a second transparent coating layer, a second transparent adhesive layer, and a second release layer were stacked in this order, with no other layer configuration. That is, the above-described high-temperature and high-humidity environment test was carried out using a transparent piezoelectric laminated film in which the peelable release layer was included in the optical adhesive sheet used as a material. Since the values of ΔE measured for the transparent piezoelectric laminated film having the release layer are the values shown in the tables, it can be determined that ΔE is equal to or less than the values shown in the tables when the transparent piezoelectric laminated film is practically used without a release layer.

$$\Delta E = \{(\Delta L^*)^2 + (\Delta a^*)^2 + (\Delta b^*)^2\}^{0.5} \qquad \text{[Equation]}$$

Figure 4:
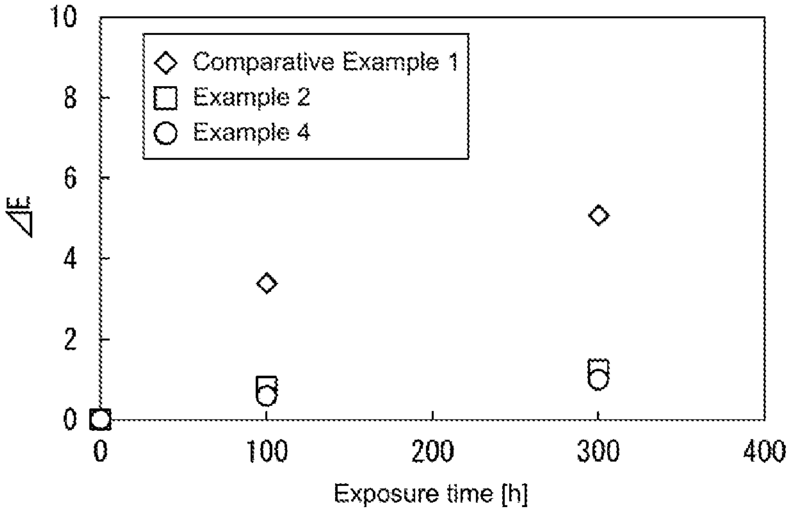
FIG. 4 is a graph showing ΔE values when each of the transparent piezoelectric laminated films of Examples according to the present invention and Comparative Examples was placed in a high-temperature and high-humidity environment.

The evaluation results are listed in Table 1 to Table 3. The L* value, a* value and b* value in Table 1 and Table 3 are values after 300 hours in the high-temperature and high-humidity environment test, and ΔE is the value of the color difference before and after the high-humidity and high-heat environment test was performed for 300 hours. Further, FIG. 4 illustrates the relationship between the test time and the color difference ΔE in the high-temperature and high-humidity environment test for the transparent piezoelectric laminated films of Examples 2 and 4 and the transparent piezoelectric laminated film of Comparative Example 1. When the elapsed time is 300 hours and ΔE is 4.0 or less, it can be determined that the touch panel has sufficient durability in a high-temperature and high-humidity environment for use in a touch panel.

directly interposed between the transparent piezoelectric film and the optical adhesive sheet, and thus the action of the component in the optical adhesive sheet that discolors the transparent piezoelectric film on the transparent piezoelectric film is sufficiently suppressed.

On the other hand, in all of the transparent piezoelectric laminated films of Comparative Examples 1 to 3, discoloration (yellowing) over time under a high-temperature and high-humidity environment is remarkable as compared with the transparent piezoelectric laminated films of Examples 1 to 6. It is thought that this is because the optical adhesive

TABLE 1

| | Transparent coating layer | | Type of optical adhesive sheet | | Optical characteristics | | | | | |
|---|---|---|---|---|---|---|---|---|---|---|
| | Position | Thickness (μm) | | $d_{33}$ (pC/N) | Total light transmittance (%) | Haze value (%) | L* (—) | a* (—) | b* (—) | ΔE 300 hours |
| Example 1 | Both sides | 0.97 | Acrylic 1 | 16.4 | 91.9 | 0.5 | 96.8 | −0.1 | 0.4 | 0.6 |
| Example 2 | Both sides | 0.42 | Acrylic 1 | 17.0 | 91.7 | 0.6 | 96.6 | 0.7 | 0.2 | 1.0 |
| Example 3 | Both sides | 0.65 | Acrylic 1 | 16.5 | 91.7 | 0.5 | 96.7 | 0.1 | 0.3 | 0.9 |
| Example 4 | Both sides | 2.00 | Acrylic 1 | 14.6 | 91.8 | 0.5 | 96.8 | 0.0 | 0.5 | 0.8 |
| Example 7 | Both sides | 4.0/1.0* | Acrylic 1 | 13.9 | 91.7 | 0.5 | 96.7 | 0.1 | 0.3 | 0.7 |
| Example 8 | Both sides | 10.0/1.0* | Acrylic 1 | 9.0 | 91.7 | 0.5 | 96.7 | 0.0 | 0.4 | 0.7 |
| Comparative Example 1 | No | — | Acrylic 1 | 18.6 | 93.7 | 2.9 | 96.5 | 0.1 | 0.8 | 5.1 |
| Comparative Example 4 | Both sides | 0.16 | Acrylic 1 | 18.0 | 92.8 | 2.7 | 96.6 | 0.1 | 0.6 | 2.9 |

*The transparent coating layers on both sides each have different thicknesses as indicated.

TABLE 2

| | Transparent coating layer | | Type of optical adhesive sheet | | Optical characteristics | | | | | |
|---|---|---|---|---|---|---|---|---|---|---|
| | Position | Thickness (μm) | | $d_{33}$ (pC/N) | Total light transmittance (%) | Haze value (%) | L* (—) | a* (—) | b* (—) | ΔE 300 hours |
| Example 5 | Both sides | 0.97 | Acrylic 2 | 16.4 | 91.9 | 0.5 | 96.8 | −0.1 | 0.4 | 2.3 |
| Comparative Example 2 | No | — | Acrylic 2 | 18.6 | 93.7 | 2.9 | 96.5 | 0.1 | 0.8 | 9.1 |

TABLE 3

| | Transparent coating layer | | Type of optical adhesive sheet | | Optical characteristics | | | | | |
|---|---|---|---|---|---|---|---|---|---|---|
| | Position | Thickness (μm) | | $d_{33}$ (pC/N) | Total light transmittance (%) | Haze value (%) | L* (—) | a* (—) | b* (—) | ΔE 300 hours |
| Example 6 | Both sides | 1.10 | Acrylic 1 | 18.6 | 91.5 | 0.7 | 95.6 | −0.5 | 1.1 | 3.3 |
| Comparative Example 3 | No | — | Acrylic 1 | 23.3 | 93.7 | 3.0 | 95.8 | −0.5 | 0.9 | 7.7 |

DISCUSSION

All of the transparent piezoelectric laminated films of Examples 1 to 6 have sufficiently high transparency even in a high-temperature and high-humidity environment, have sufficiently little discoloration, and have sufficient durability in a high-temperature and high-humidity environment. It is thought that this is because the transparent coating layer is sheet is bonded to the transparent piezoelectric film, and thus the component in the optical adhesive sheet that discolors the transparent piezoelectric film acts on the transparent piezoelectric film.

Further, the transparent coating film used in Comparative Example 4 has a higher haze value than the transparent coating films of Examples 1 to 6. This is thought to be because the transparent coating layer has a small thickness and cannot sufficiently cover the surface of the transparent piezoelectric film, and thus scratch prevention action in production was insufficient.

INDUSTRIAL APPLICABILITY

The present invention can be used in a touch panel.

REFERENCE SIGNS LIST

1 Transparent piezoelectric film
2, 2*a*, 2*b*, 2*c* Transparent coating layer
3, 3*a*, 3*b*, 3*c*, 3*d* Transparent adhesive layer
4*a*, 4*b*, 4*c* Transparent electrode
5 Cover glass
6*a*, 6*b*, 6*c* Transparent substrate
10, 20 Transparent piezoelectric laminated film
30 Display
100 Touch panel

The invention claimed is:

1. A transparent piezoelectric laminated film comprising, by sequentially stacking:

a transparent piezoelectric film made of a fluororesin;

a transparent coating layer having a thickness of 0.20 μm or more; and a transparent adhesive layer wherein ΔE is 4.0 or less when the transparent piezoelectric laminated film is left in an environment of 85° C. and 85% RH for 300 hours.

2. The transparent piezoelectric laminated film of claim 1, wherein the thickness of the transparent coating layer is 4.0 μm or less.

3. The transparent piezoelectric laminated film according to claim 1, wherein the transparent coating layer is made of a (meth) acrylic acid ester resin.

4. The transparent piezoelectric laminated film according to claim 1, wherein the transparent adhesive layer contains an acrylic resin-based adhesive.

5. The transparent piezoelectric laminated film according to claim 1, wherein the transparent coating layer and the transparent adhesive layer are disposed on both surface sides of the transparent piezoelectric film, respectively.

6. A touch panel comprising:

the transparent piezoelectric laminated film described in claim 1.

* * * * *